(12) United States Patent
Bao et al.

(10) Patent No.: US 8,970,322 B2
(45) Date of Patent: Mar. 3, 2015

(54) WAVEGUIDE BASED FIVE OR SIX PORT CIRCUIT

(75) Inventors: Mingquan Bao, Vastra Frolunda (SE); Per Ligander, Gothenburg (SE)

(73) Assignee: Telefonaktiebolaget L M Ericsson (Publ), Stockholm (SE)

( * ) Notice: Subject to any disclaimer, the term of this patent is extended or adjusted under 35 U.S.C. 154(b) by 74 days.

(21) Appl. No.: 13/977,607

(22) PCT Filed: Dec. 29, 2010

(86) PCT No.: PCT/EP2010/070870
§ 371 (c)(1),
(2), (4) Date: Jun. 28, 2013

(87) PCT Pub. No.: WO2012/089253
PCT Pub. Date: Jul. 5, 2012

(65) Prior Publication Data
US 2013/0278351 A1    Oct. 24, 2013

(51) Int. Cl.
H01P 5/12    (2006.01)
H01P 3/12    (2006.01)
H03D 3/00    (2006.01)
H03D 9/04    (2006.01)
H04B 1/30    (2006.01)
H04L 27/38   (2006.01)

(52) U.S. Cl.
CPC .. *H01P 3/12* (2013.01); *H01P 5/12* (2013.01); *H03D 3/007* (2013.01); *H03D 9/04* (2013.01); *H04B 1/30* (2013.01); *H04L 27/38* (2013.01)
USPC .......................................... 333/135; 333/134

(58) Field of Classification Search
USPC ................................................. 333/134, 135
See application file for complete search history.

(56) References Cited

U.S. PATENT DOCUMENTS

| | | | | |
|---|---|---|---|---|
| 7,565,116 B2 * | 7/2009 | Okuyama et al. | ............... | 455/83 |
| 2003/0015767 A1 * | 1/2003 | Emrick et al. | ................ | 257/528 |
| 2009/0000106 A1 * | 1/2009 | Chuang et al. | ................. | 29/600 |
| 2009/0051463 A1 * | 2/2009 | Callewaert | ..................... | 333/134 |
| 2009/0153272 A1 * | 6/2009 | Rosenberg et al. | ........... | 333/208 |
| 2010/0171566 A1 * | 7/2010 | Callewaert | ..................... | 333/134 |
| 2011/0026443 A1 * | 2/2011 | Okada et al. | .................. | 370/280 |
| 2013/0278351 A1 * | 10/2013 | Bao et al. | ...................... | 333/135 |
| 2014/0139386 A1 * | 5/2014 | Liu et al. | ................ | 343/781 CA |
| 2014/0152389 A1 * | 6/2014 | Hamparian | .................... | 330/295 |

FOREIGN PATENT DOCUMENTS

KR    10 20040022686 A    3/2004

OTHER PUBLICATIONS

Hyyrylainen et al. "Six-port Direct Conversion Receiver" Microwave Conference, 1997, IEEE, XP031605550, pp. 341-346.
Koelpin et al. "The Six-Port in Modern Society" IEEE Microwave Magazine, IEEE Service Center, vol. 11, No. 7, 2010, XP011319293, pp. 35-43.
Mohajer et al. "A Software Defined Radio Direct Conversion Receiver" Wireless Technology, 2005, IEEE, XP010909170, pp. 443-446.
Morena-Alvarez-Palencia et al. "Three Octave Six-Port Network for a Broadband Software Radio Receiver" Microwave Conference (EUMC), 2010, IEEE, XP031785891, pp. 1110-1113.

* cited by examiner

*Primary Examiner* — Adam Houston
(74) *Attorney, Agent, or Firm* — Rothwell, Figg, Ernst & Manbeck, P.C.

(57) ABSTRACT

A five-six-port circuit comprising a waveguide on a main surface of a substrate. The hollow waveguide comprises probes arranged longitudinally inside the hollow waveguide arranged to contact the input port of one of three power detectors, whose output ports are arranged to contact the input port of one power detector. The output ports of the power detectors contact the conductor of an open waveguide which extends in parallel to the hollow waveguide. The probes are equidistantly spaced with a distance of L. The circuit also comprises three LP filters, each of which is connected to the conductor of the open waveguide at a position which corresponds to the position of one of the power detectors.

26 Claims, 11 Drawing Sheets

WAVEGUIDE BASED FIVE OR SIX PORT CIRCUIT

CROSS REFERENCE TO RELATED APPLICATION(S)

This application is a 35 U.S.C. §371 National Phase Entry Application from PCT/EP2010/070870, filed Dec. 29, 2010, designating the United States, the disclosure of which is incorporated herein in its entirety by reference.

TECHNICAL FIELD

The present invention discloses a novel five or six port circuit.

BACKGROUND

Five and six-port circuits are often applied in microwave systems and in wireless communications systems, in particular for use in homodyne receivers. In a five/six-port circuit, there are two input ports and three/four output ports. The input ports of a five/six port circuit are connected to an RF signal and an LO signal, respectively, while the signals at the output ports of the five/six-port circuit are used as input to power detectors, with one power detector for each output port each.

Using the power measured by the power detectors, the in-phase and quadrature components of the base-band signal can be determined. As compared with a receiver which utilizes mixers, a receiver with a five/six port circuit has advantages regarding low DC power consumption, low circuit complexity, low cost, as well as wide bandwidth and re-configurability.

A conventional five/six-port circuit for receivers is often built on a substrate, and is usually a planar circuit which consists of Wilkinson power splitters and 90 degree hybrid couplers, usually designed as microstrip lines on a microwave motherboard. At very high frequencies, for instance, at 60 GHz, such a five/six-port circuit can be integrated with transistors and diodes on MMIC or RFIC chips.

In many microwave applications, existing waveguides are used to connect between a five/six-port circuit designed as a planar circuit and, for example, an antenna or a waveguide duplexer. A waveguide transition, e.g. a microstrip-to-waveguide transition is required for such a connection, which adds to the costs when using a planar five/six port circuit, and which also causes losses at the transition.

SUMMARY

It is an object of the present invention to obviate at least some of the above mentioned drawbacks of a conventional five/six-port circuit and to provide an improved five/six-port circuit.

This object is met by the present invention in that it discloses a five-port circuit which comprises a hollow waveguide mounted with a contacting surface on a first main surface of a non-conducting substrate.

The hollow waveguide comprises an input port at its one end and a matched load at its other end, and the five-port circuit additionally comprises three probes which are arranged along the longitudinal extension of the hollow waveguide. The five-port circuit also comprises three power detectors, with each probe being arranged to contact the input port of one of the power detectors. The output ports of the power detectors are arranged to contact the conductor of an open waveguide which is also comprised in the five-port circuit and which extends in parallel to the hollow waveguide, with an input port at its one end and a matched load at its other end, i.e. a load which is equal to the characteristic impedance of the hollow waveguide.

In the five-port circuit, the probes are equidistantly spaced with a distance L between neighbouring probes which corresponds to an electrical length $\theta$, defined as $\theta = 2\pi L/\lambda$, where $\lambda$ is the wavelength which corresponds to the operational frequency of the five-port circuit, and the five-port circuit also comprises three low pass filters, each of which is connected with its input port to the conductor of the open waveguide at a position which corresponds to the position of one of the power detectors, so that each probe is arranged in a straight line with one of the power detectors and one of the low pass filters.

The output ports of the low pass filters are arranged to be used as the output ports of the five-port circuit, and the input ports of the hollow waveguide and the open waveguide are arranged at distal ends from each other.

Thus, by means of probes arranged inside the hollow waveguide, a transition between waveguide and the open waveguide is not needed, and accordingly, the problems with such transitions are obviated by means of the invention. In addition, since the input ports of the hollow waveguide and the open waveguide are arranged at distal ends from each other, signals which are connected to those input ports will propagate in opposite directions to each other, which is also useful, as will be realized from the detailed description given in this text.

The invention also discloses a six-port circuit, which comprises the five-port circuit described above, but which is also equipped with one additional probe, power detector and low pass filter. The additional probe is arranged to contact the input port of the additional power detector and the output port of the additional power detector is arranged to contact the conductor of the open waveguide. All four probes are equidistantly arranged at a distance L which corresponds to the electrical length $\theta$, and the additional probe is arranged in a straight line with the additional power detector and the additional low pass filter.

The input ports of the hollow waveguide and the open waveguide are arranged at distal ends from each other, which means that input signals to the hollow waveguide and to the open waveguide will propagate in opposing directions.

In embodiments of the five/six-port circuit described above, the probes are through-going from the contacting surface of the hollow waveguide to a second main surface of the substrate.

In embodiments of the five/six-port circuit described above, the probes are arranged to contact the power detectors inside or on the surface of the non-conducting substrate.

In some embodiments of the five/six-port circuit, the hollow waveguide and the open waveguides are straight.

In some embodiments of the five/six-port circuit, the hollow waveguide is a surface mounted waveguide, i.e. the contacting surface comprises a separate part of the hollow waveguide which has been fixed to the rest of the hollow waveguide.

In some embodiments of the five/six-port circuit, the power detectors, the open waveguide and the low pass filters are arranged on the second main surface of the substrate.

In some embodiments of the five/six-port circuit, the power detectors, the open waveguide and the low pass filters are arranged on the first main surface of the substrate, and the probes are connect to the power detectors via a connecting open waveguide on the second main surface of the substrate which connects to the power detectors by means of via holes in the substrate. In such embodiments, the connecting open waveguide can be arranged either on the second main surface of the substrate or inside the substrate.

In some embodiments of the five/six-port circuit, the open waveguide is a microstrip line.

In some embodiments of the five/six-port circuit, the open waveguide is a coplanar waveguide line.

According to a method of the invention for using the five- or six-port circuit described above, an LO signal is input to one of the input ports and an RF signal is input to the other input port, and the LO frequency is chosen to be half of RF frequency. Such a choice of LO frequency solves the problem of leakage of the LO signal into the RF input port, since a frequency which is half of the RF frequency will be below the cutoff frequency of the hollow waveguide. Suitably, the RF signal is used as input signal to the hollow waveguide and the LO signal is used as input signal to the open waveguide, although the opposite is also useful, i.e. that the LO signal is used as input signal to the hollow waveguide and the RF signal is used as input signal to the open waveguide.

BRIEF DESCRIPTION OF THE DRAWINGS

The invention will be described in more detail in the following, with reference to the appended drawings, in which.

DETAILED DESCRIPTION

Figure 1:
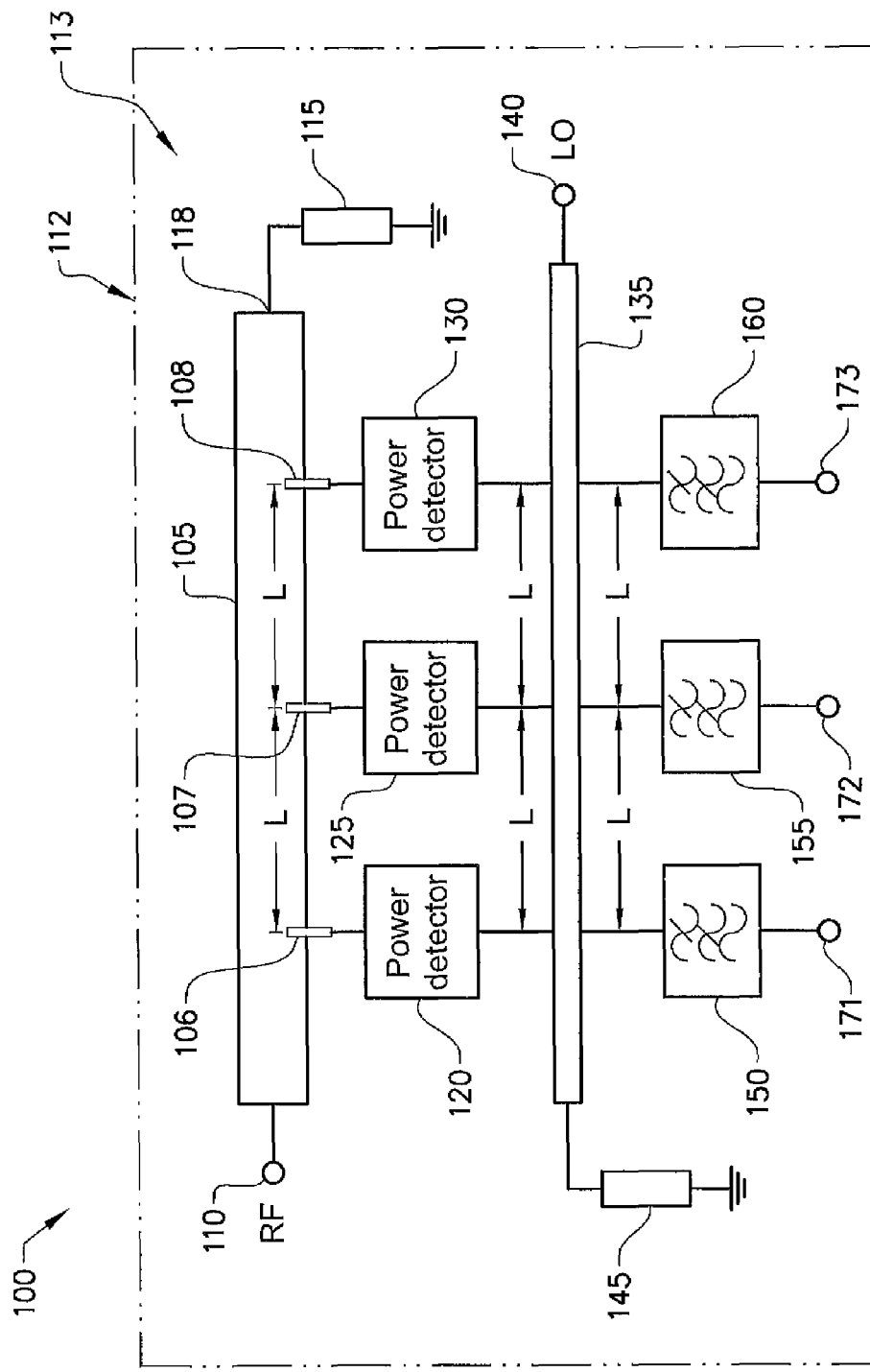
FIG. 1 shows an open top view of a first embodiment of the invention.

Embodiments of the present invention will be described more fully hereinafter with reference to the accompanying drawings, in which embodiments of the invention are shown. The invention may, however, be embodied in many different forms and should not be construed as being limited to the embodiments set forth herein. Like numbers in the drawings refer to like elements throughout.

The terminology used herein is for the purpose of describing particular embodiments only, and is not intended to limit the invention.

FIG. 1 shows an open top view of a first embodiment 100 of a five-port circuit of the invention. The embodiment 100 comprises a hollow waveguide 105 which has a lateral extension, and which is arranged on a first main surface 113 of a non-conducting substrate 112. In this particular embodiment, the hollow waveguide 105 extends in a straight line, which is suitable but not necessary, the hollow waveguide 105 can "meander" or have other varying bent forms along the first main surface 113 of the substrate 112. At its one end 110, the hollow waveguide has an input port for, for example, RF-signals, and at its other end 118, it has a matched load 115, i.e. a load which has an impedance equal to characteristic impedance of the hollow waveguide.

The term "hollow waveguide" is used here in order to distinguish the waveguide 105 from such technologies as microstrip or strip line.

The hollow waveguide 105 is mounted on the first main surface 113 of the non-conducting substrate 112 in such a way that a contacting surface of the hollow waveguide contacts the first main surface 113. The five-port circuit 100 also comprises three probes 106, 107 and 108, which are suitably through-going from the contacting surface of the hollow waveguide 105 to a second main surface of the substrate 112, i.e. to the "bottom surface" of the substrate 112, if the side on which the hollow waveguide is located is seen as the top surface of the substrate 112. Naturally, in other embodiments, the probes can be made to extend to "side surfaces" such as edges of the substrate 112, if desired.

Each probe 106, 107, 108 is, in a manner which will be described in more detail later, connected to the input port of a power detector 120, 125, 130, with one power detector for each probe.

The five-port circuit 100 also comprises a microstrip line 135, of which the conductor is seen in FIG. 1. Alternatively, instead of a microstrip line, the five-port circuit can instead use a co-planar waveguide; these two technologies are here referred to as "open waveguides". In addition, the term "microstrip line" may also be used in this text to refer to what is actually the conductor of the microstrip line—the ground plane of the microstrip line is suitably arranged on the opposite surface of the substrate 112 or inside the substrate 112.

The microstrip line 135 extends in parallel to the hollow waveguide 105, and the output ports of the power detectors 120, 125 and 130 are connected to the microstrip line 135.

As shown in FIG. 1, the microstrip line 135 has a matched load 145 at its one end and an input port 140 for signals such as, for example, LO-signals at its other end. As shown in FIG. 1, the input ports 110 and 140 of the hollow waveguide and the microstrip line are placed at opposing ends, as are their matched loads 115 and 145, so that signals which are connected to the hollow waveguide will propagate in a direction opposite to the propagation direction of signals which are connected to the microstrip line. In the example shown in FIG. 1, RF-signals are connected to the hollow waveguide and LO-signals to the microstrip line, although the opposite is also perfectly feasible, i.e. LO-signals to the hollow waveguide and RF-signals to the microstrip line.

Thus, input signals are input to the input ports at opposing ends of the hollow waveguide 105 and the microstrip line 135. The input signals to the hollow waveguide are accessed by means of the probes 106, 107 and 108, and are connected to the microstrip line 135 via the power detectors 120, 125 and 130. In order to access the output signals of the five-port circuit 100, there are also arranged three low pass filters 150, 155 and 160, one for each power detector 120, 125 and 130. The bandwidth and the low pass characteristics of the low pass filters is determined by the bandwidth of the baseband signal which it is desired to receive by means of the five port circuit 100. Suitably, all of the three low pass filters 150, 155, 160 have identical filter characteristics.

As shown in FIG. 1, each probe and its corresponding power detector and low pass filter are arranged in a straight line which is perpendicular to the direction of extension of the microstrip line 135 and the hollow waveguide 105. As is also shown in FIG. 1, the probes 106, 107 and 108 are equidistantly spaced along the direction of extension of the hollow waveguide 105, with a distance L between neighbouring probes, which corresponds to an electrical length of $\theta=2\pi L/\lambda$, where $\lambda$ is the wavelength which corresponds to the operational frequency of the five-port circuit 100.

Thus, if the input port of each low pass filter is connected to the microstrip line, the three output signals of the five port circuit 100 can be accessed at the respective output ports of the low pass filters, shown as 171, 172, and 173 in FIG. 1. The phase differences between the signals at the output ports and how those phase differences are obtained will be explained later in this text.

In FIG. 1, RF signals are shown as the input signals to the hollow waveguide 105, and LO signals as the input signals to the open waveguide 135. This is an example only, other signals can of course also be used, and if RF and LO signals, are used, they can also be input in "the other way", i.e. LO signals to the hollow waveguide 105 and RF signals to the open waveguide 135.

Figure 2:
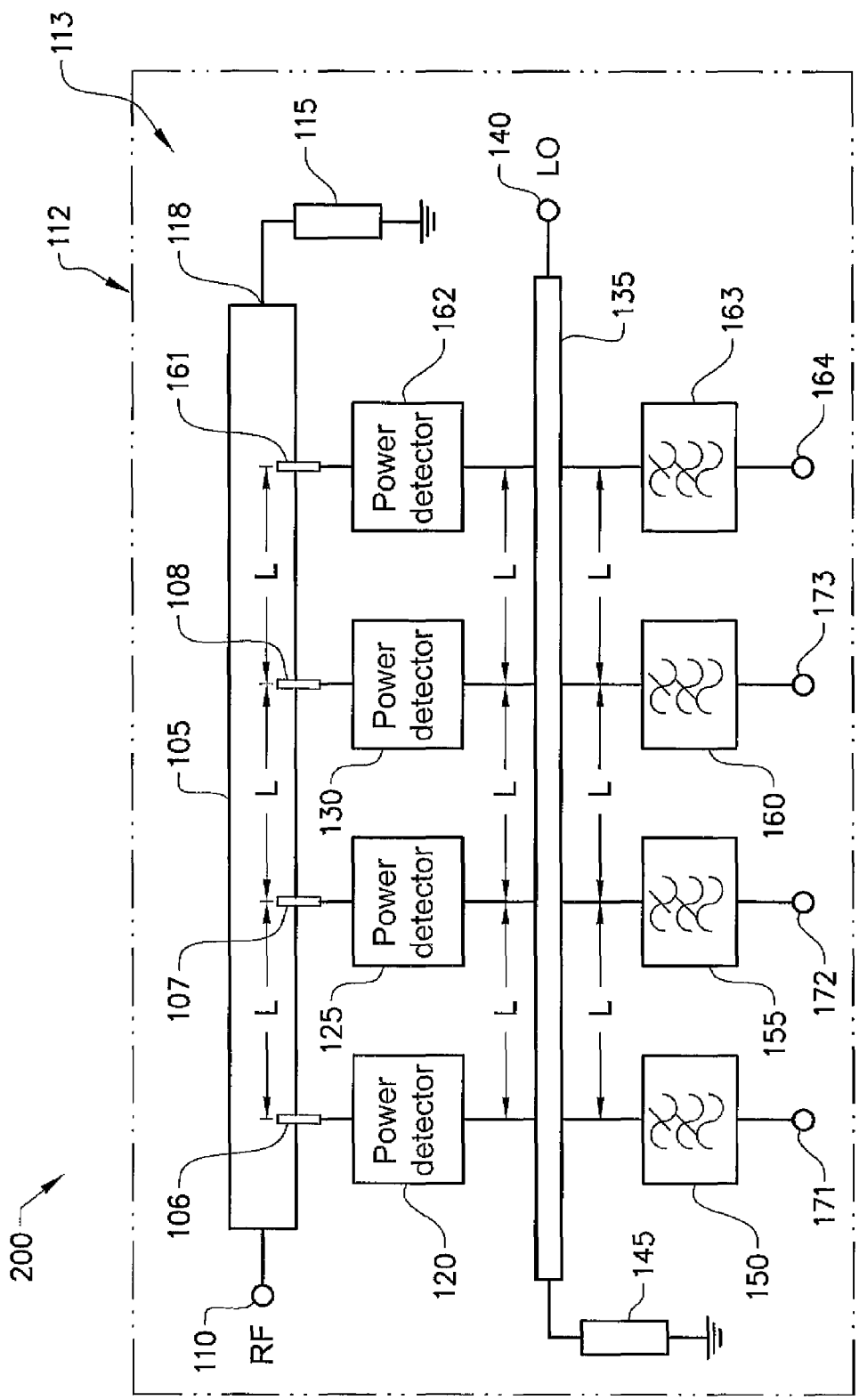
FIG. 2 shows an open top view of a second embodiment of the invention.

FIG. 2 shows an embodiment 200 of the invention, which follows the same principles as those described above in connection with the embodiment 100 of FIG. 1, with reference numbers being retained from FIG. 1. However, as opposed to the embodiment 100, the embodiment 200 is a six-port circuit, as opposed to the five-port circuit of FIG. 1. Since the principles used by the embodiment 200 are the same as those of the embodiment 100, the basic function of the embodiment 200 will not be repeated here, but as shown in FIG. 2, the embodiment 200 comprises a fourth "set" of probe 161, power detector 162 and low pass filter 163, where the output port 164 of the fourth low pass filter 263 is used as the fourth output port of the six-port circuit 200. As also shown in FIG. 2, the equidistant spacing L between the probes is used here as well, as is the principle of arranging the fourth probe 261 and its accompanying power detector 262 and low pass filter 263 in a straight line, perpendicular to the microstrip line 140. The invention will be described below as being a five-port circuit, but it should be made clear that the principles disclosed herein can equally well be applied to embodiments such as the one in FIG. 2, i.e. to six-port circuits. In the following text, the invention will be described with reference to a five-port circuit such as the one on FIG. 1. However, it should be understood that the same principles can equally well be applied to a six-port circuit such as the one in FIG. 3, or in fact to an N-port circuit, where N is an integer larger than or equal to four.

Figure 3:
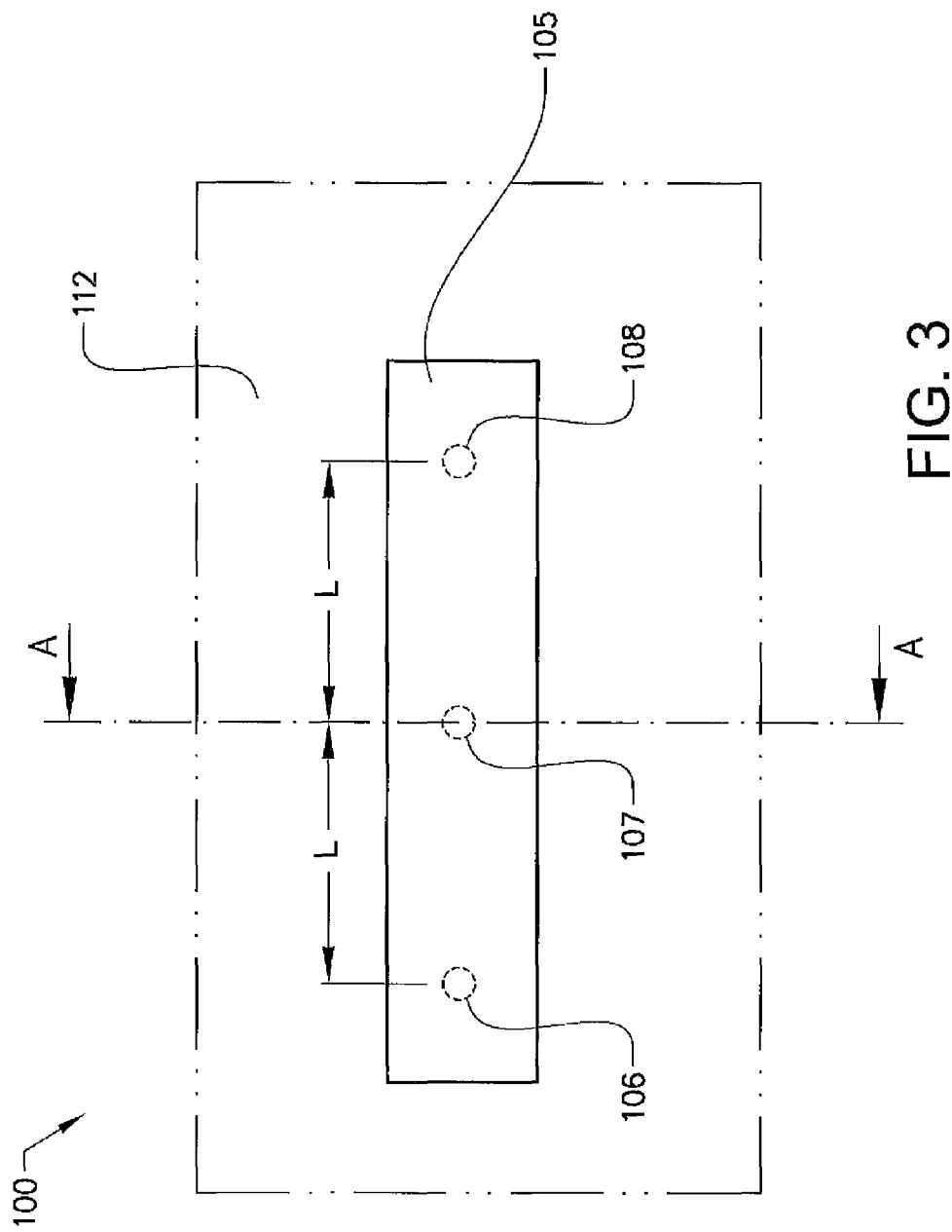
FIG. 3 shows a top view of the embodiment of FIG. 1.

FIG. 3 shows an open top view of part of the embodiment 100 of the invention, in which the hollow waveguide 105 is shown, along with the three probes 106, 107 and 108. The equidistant spacing L between the probes can also be seen clearly. The first main surface 113 of the substrate 112 is shown with dashed lines in order to indicate that what is seen in FIG. 3 may be only a part of the first main surface 113, i.e. a "cut-out".

Figure 4:
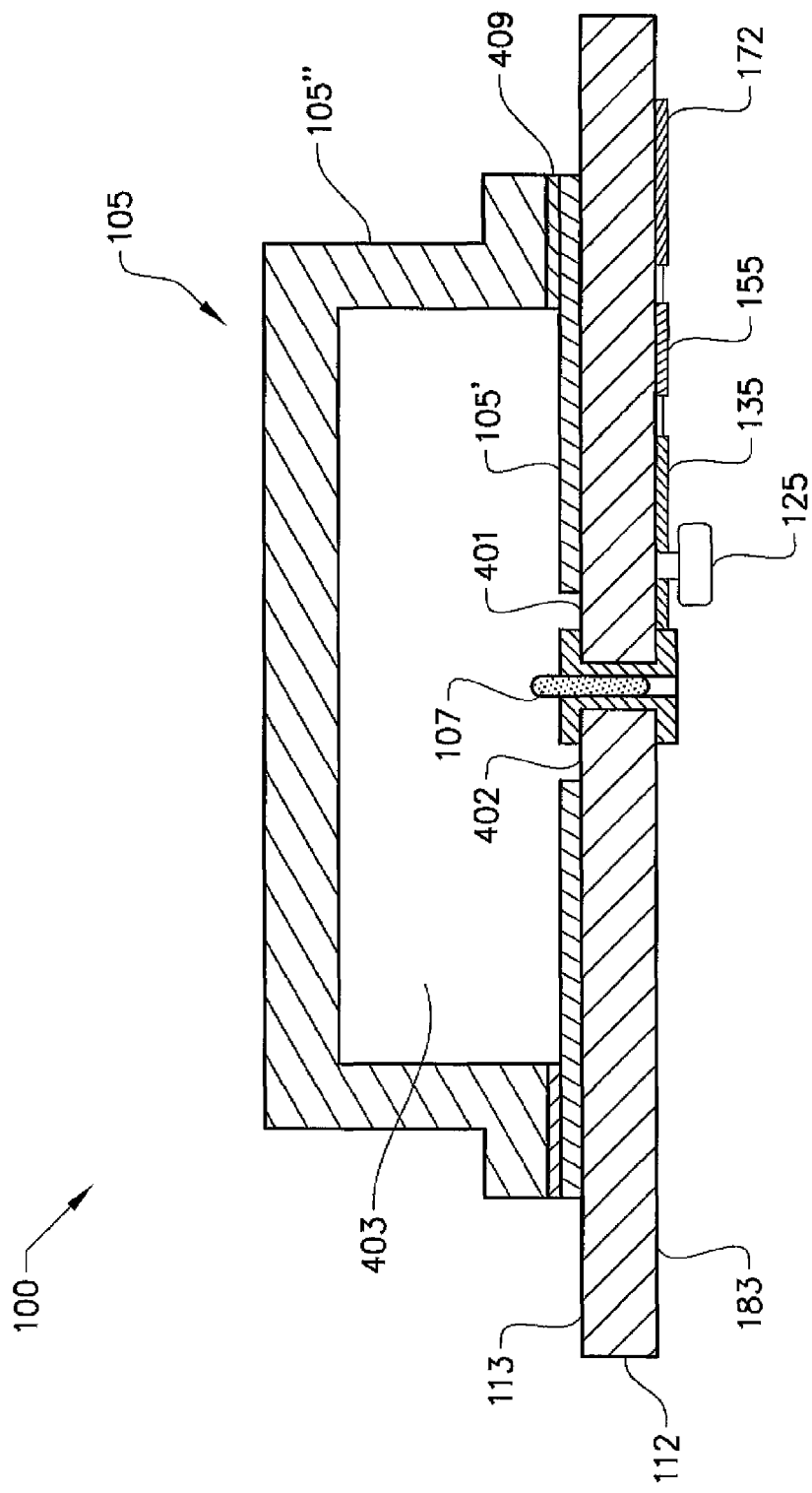
FIG. 4 shows a cross section of the embodiment of FIG. 1 and FIG. 3.

FIG. 4 shows a cross-section of the embodiment 300 along the line A-A indicated in FIG. 3. The hollow waveguide 105 is seen clearly, as is the cavity 403 inside of it. The substrate 112 is also shown here, as is the first main surface 113 on which the hollow waveguide is arranged. In this embodiment, the hollow waveguide is a so called surface mounted waveguide, in which the hollow waveguide 105 comprises a first part 105' which is mounted on the first main surface 113 and which here becomes the contacting surface of the hollow waveguide 105, and a second part 105" which is attached to the first part 105', suitably by means of solder 409. The probe 107 is also shown, and in FIG. 4 the probe 107 (as well as the other probes) is shown as extending through a via hole from the cavity 403 of the hollow waveguide through the contacting surface 105', and contacts the power detector 125 by means of metallic material from the via hole to the power detector 125 on the second main surface 183 of the substrate 112. Thus, in this embodiment, the probe 107 contacts the power detector inside the via hole, although the probe 107 can of course also be made through going to the second main surface 183, where it then contacts the power detector directly or by means of conducting material.

The embodiment 300 comprises the low pass filters 171, 172, 173, the open waveguide 135 and the power detectors 120, 125, 130 shown in FIG. 1, all of which are arranged on the second main surface 183 of the substrate. In the cross section of FIG. 4, the open waveguide 135, the power detector 125 and the low pass filter 172 can be seen, since they "belong to" the probe 107. As can also be seen in FIG. 4, the probe 107 is surrounded by a groove, suitably annular, in the conducting material of the contacting surface 105', so as to protect the probe from short-circuiting the hollow waveguide. Since FIG. 4 is a cross sectional view, two parts 401, 402 of the groove around the probe 107 are seen in FIG. 4, but the groove is in a contiguous suitably annular shape. Such grooves are also arranged around the other probes, i.e. the probes 106 and 108.

Figure 5:
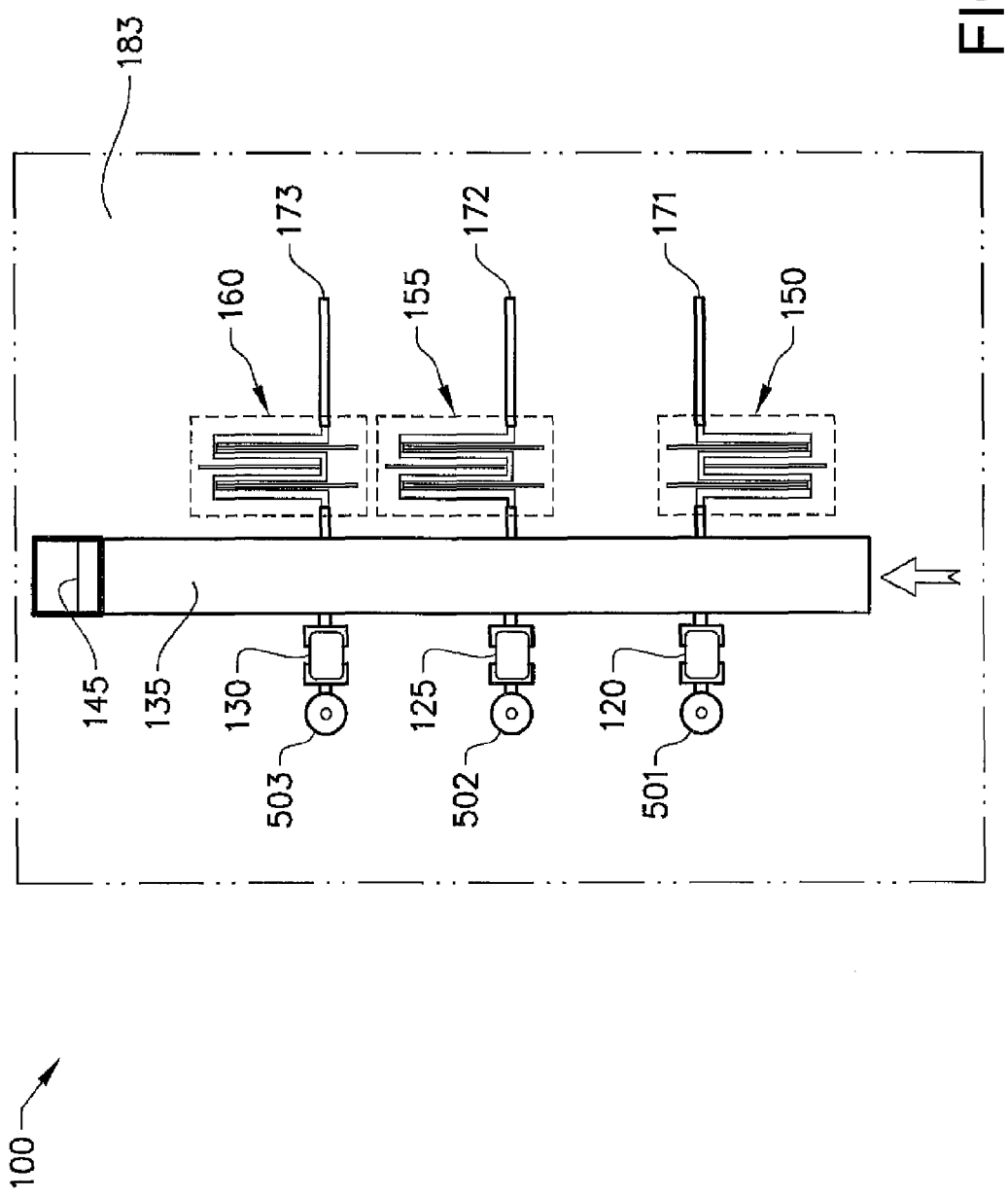
FIG. 5 shows a bottom view of the embodiment of FIG. 1.

In FIG. 5, the embodiment 100 is shown in a "bottom view", i.e. the second main surface 183 of the substrate 112 is shown. Since the microstrip line 135 in this embodiment is arranged on the second main surface 183 of the substrate 112, the conductor of the microstrip line is seen in its entirety in FIG. 5, with the ground plane suitably being arranged on the first main surface of the substrate 112. Also shown in FIG. 5 are the probes 106, 107, 108, which reach the second main surface 183 from the inside of the hollow waveguide through via-holes 503, 502, 501.

Also shown in FIG. 5 are the power detectors 130, 125, 120, which are arranged to connect with their input ports to respective probes 108, 107 and 106, and with their output ports to the microstrip line 135. On the other side of the microstrip line 135, as seen from the side of the probes and the power detector, are the low pass filters 160, 155, 150 which are arranged to connect with their input ports to the microstrip line 135 at the positions of respective power detectors 130, 125, 120, and are also arranged to have their output ports 173, 172, 171 as the output ports of the embodiment 100. FIG. 5 also shows, by means of an arrow, one end of the microstrip line 140 being arranged for used as input port to the embodiment 100, with the other end of the microstrip line having a matched load 145 arranged at it.

Figure 6:
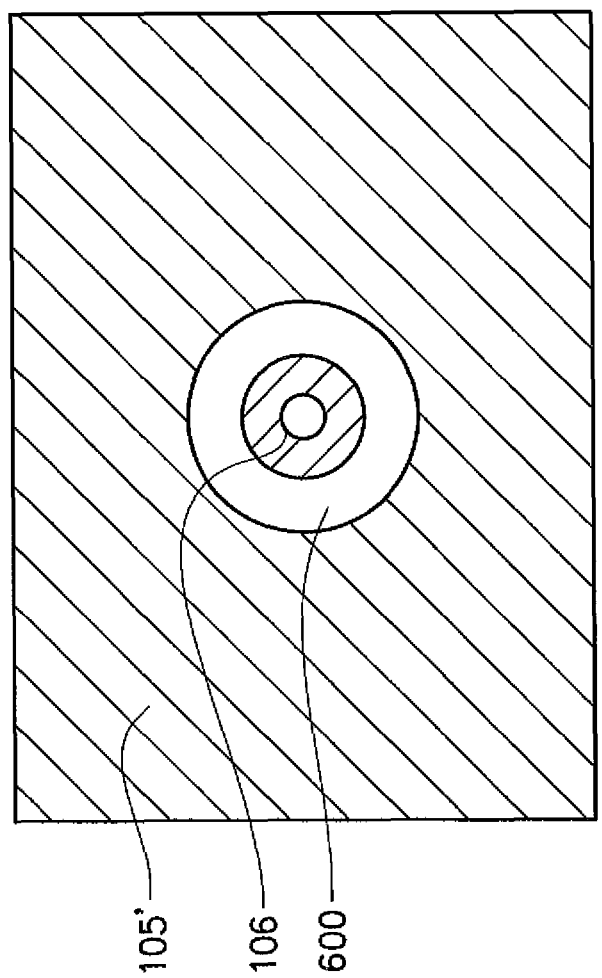
FIG. 6 shows a top view of a probe used in the invention.

FIG. 6 illustrates a probe's position in the contacting surface 105' of the hollow waveguide in more detail, with the probe 106 being used as an example: the probe 106 is made of a conducting material and is arranged in a part of the contacting surface 105' with an annular groove 600 around it, which is a groove in the contacting surface 105' of the hollow wave guide 105, down to the non-conducting material in the substrate 112. Naturally, the groove 600 can be given other shapes than annular.

Figure 7:
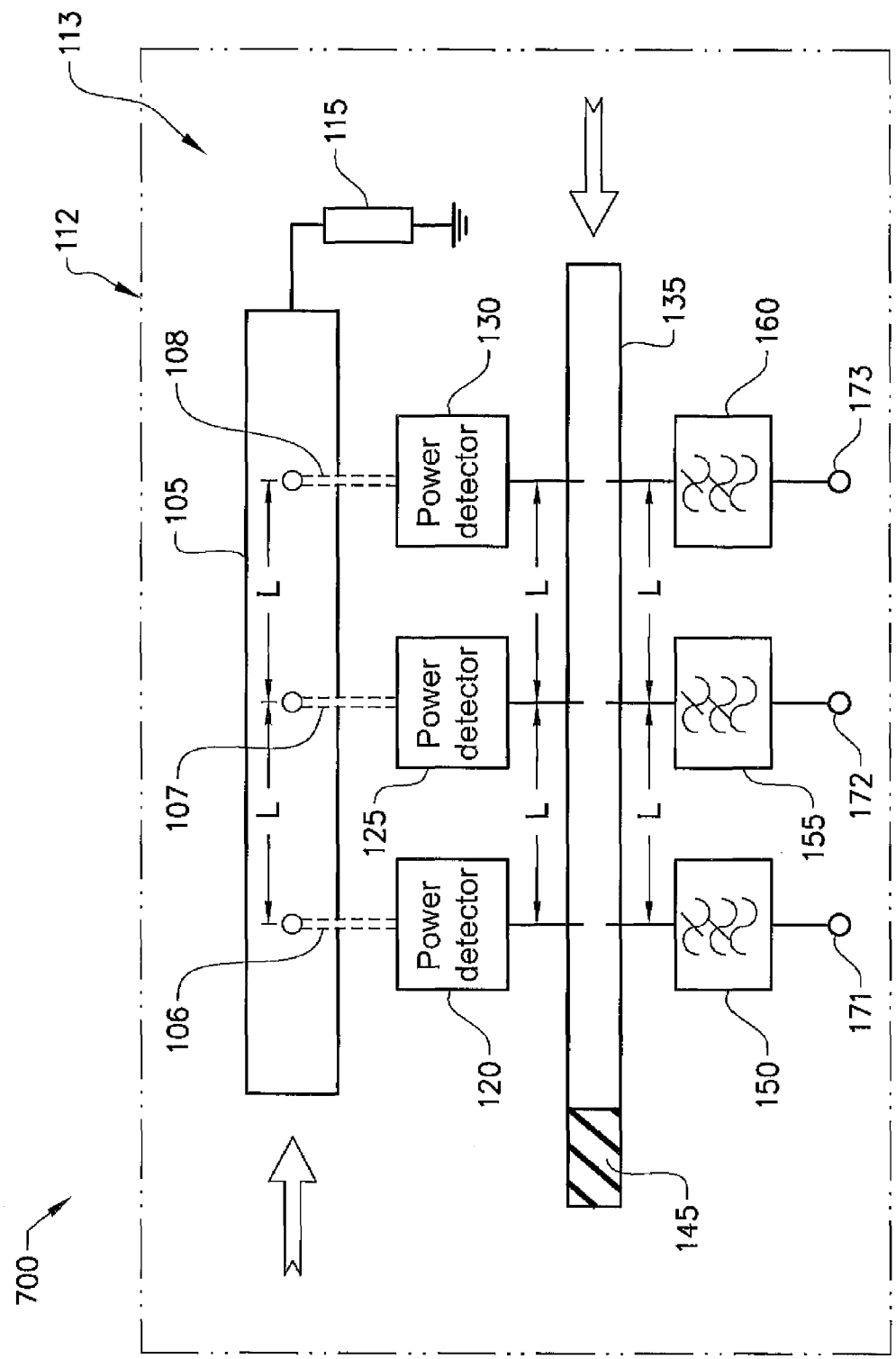
FIG. 7 shows a top view of a third embodiment of the invention.

FIG. 7 shows an example of a further embodiment 700 of the invention. As opposed to the embodiments previously shown and described, in the embodiment 700 the power detectors 120, 125, 130, the microstrip line 135 (or rather, its conductor) and the low pass filters 150, 155, 160 are arranged on the same main surface of the substrate as the hollow waveguide 105, said main surface in this case being the main surface 113. Since the components involved are the same as those in the previous embodiments, all reference numbers have been retained from the previous embodiments. In addition, although the power detectors, the microstrip line and the low pass filters are arranged on the opposite main surface of the substrate 112 as opposed to previous embodiments, the same principles are used, i.e. for each probe 106, 107, 108 there is one power detector 120, 125, 130 which contacts the microstrip line, and one low pass filter 150, 155, 160 which contacts the microstrip line 135 with its input port, and whose output port is used as an output port for the entire embodiment 700.

In addition, the matching loads at opposite ends of the hollow waveguide and the microstrip line are also used in the embodiment 700, as is the principle of using opposite ends of the hollow waveguide and the microstrip line as input ports, in order to make input signals propagate in opposing directions in the hollow waveguide and the microstrip line. Also, the equidistant spacing L is used here as well, as is the principle of arranging each "set" of probe-power detector-low pass filter in a straight line perpendicular to the extension of the hollow waveguide and the microstrip line, which extend in parallel to each other.

Figure 8:
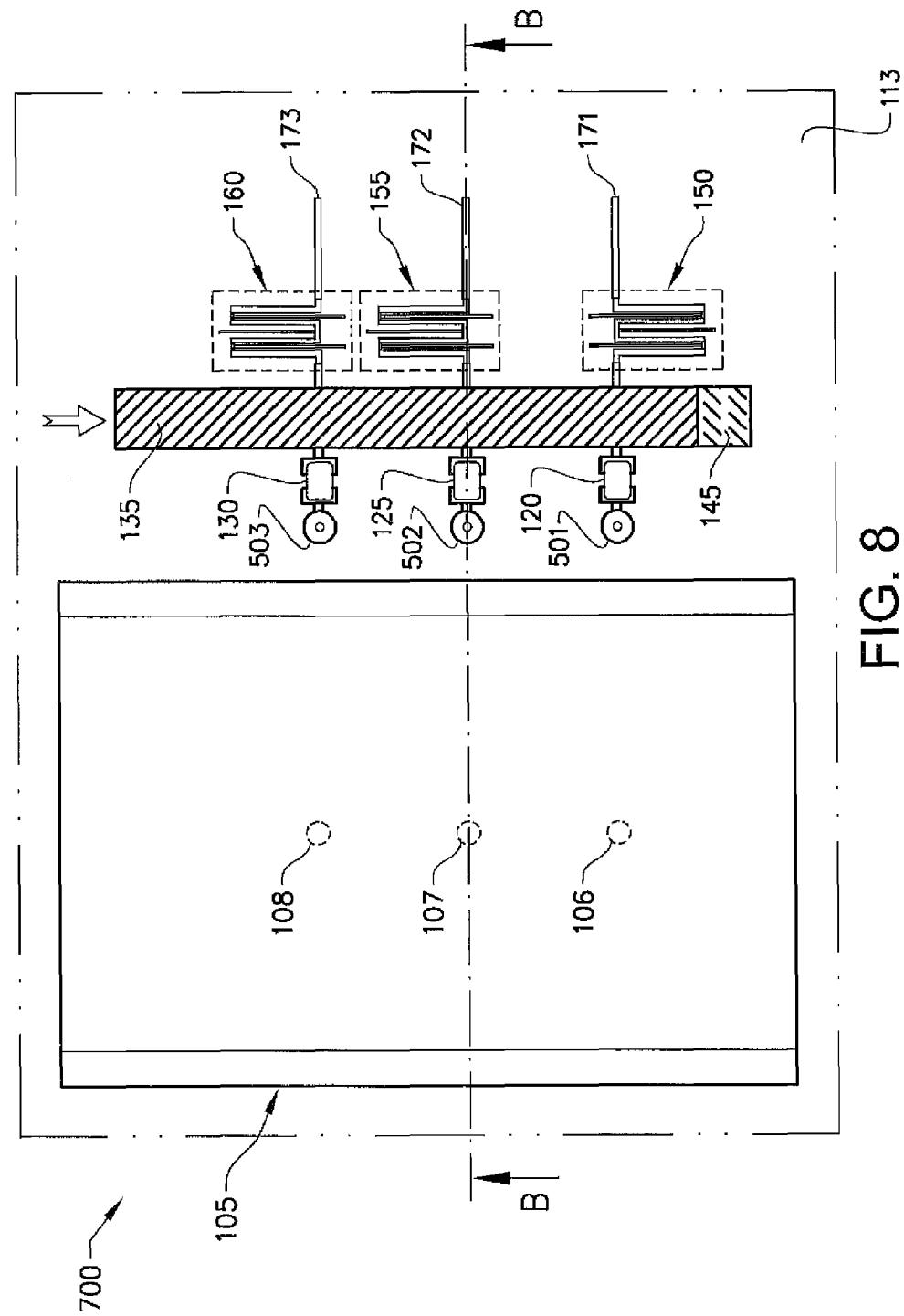
FIG. 8 shows a more detailed top view of the embodiment of FIG. 6.

FIG. 8 shows a view of the embodiment 700 which is similar to the view given in FIG. 5 of the embodiment 100. Again, here we see the hollow waveguide 105 extend in parallel to the microstrip line 135, although on the same side of the substrate 112, in this case on the first main surface 113. Between the microstrip line 135 and the hollow wave guide 105, connections from the probes 106, 107 and 108 "surface" through via-holes 503, 502 and 501, and contact the input ports of the power detectors 130, 125, 120, which in turn contact the microstrip line 135 with their output ports. On the other side of the microstrip line, as related to the position of the power detectors, the low pass filters 160, 155, 150 are arranged with their input ports to contact the microstrip line, and their output ports 171, 172 and 173 are arranged for use as output ports of the embodiment 700. As can be seen, each "set" of probe-power detector and low pass filter is arranged in a straight line, perpendicular to the hollow waveguide 105 and the microstrip line 135, which extend in parallel to each other.

Regarding the microstrip line 135, what is shown in FIGS. 7 and 8 is the conductor of the microstrip line. Suitably, a ground plane is arranged on the opposite main surface of the substrate 112, a principle which is adhered to for all embodiments in which a microstrip line is used.

Figure 9:
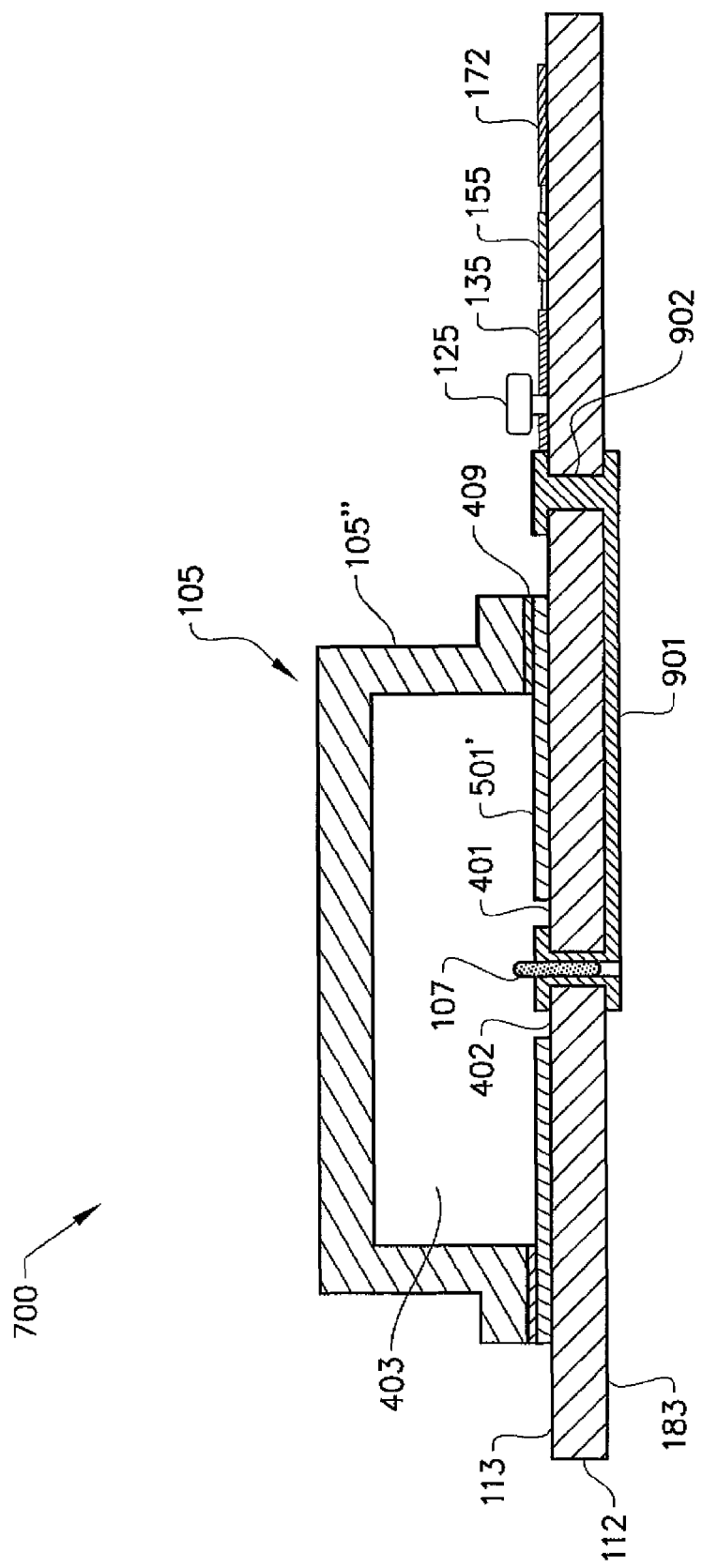
FIG. 9 shows a cross section of the embodiment of FIG. 6 and FIG. 7.

FIG. 9 shows a cross section of the embodiment 700 along the line B-B indicated in FIG. 8. In this figure, it is shown how the probes contact the power detectors, here shown with reference to the probe 107 and the power detector 125: as shown in FIG. 9, the probe 107 is through-going, and contacts a conducting line 901 on the second main surface 183 of the substrate 112, which extends in the direction of the power detector 125. At a point where the power detector 125 has its input port, there is arranged a via hole 902, through which the conducting line 901 contacts the input port of the power detector 125. The power detector 125 in turn contacts the microstrip line 135, and on the opposite side of the microstrip line 135, the low pass filter 160 is arranged to have its input port contact the microstrip line 135, and its output port is arranged to be one of the output ports of the embodiment 700.

Figure 10:
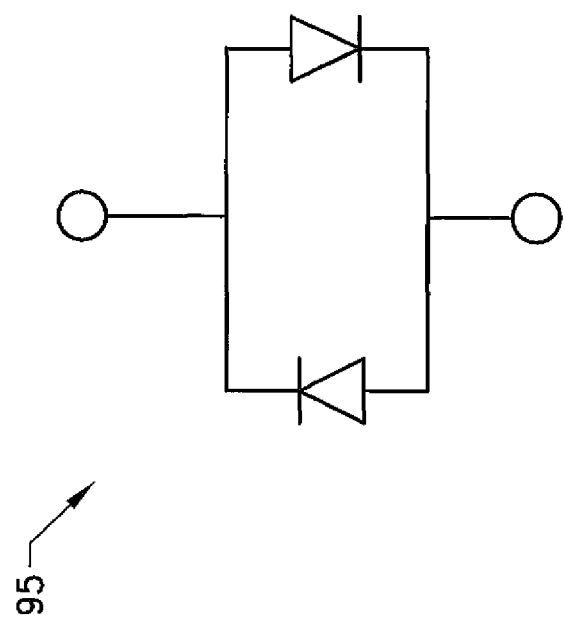
FIG. 10 shows an embodiment of a power detector for use in the invention.

FIG. 10 shows an example of an embodiment of a surface mounted power detector 95 for use as the power detector 120, 125, 130 shown in the drawings. The power detector 95 utilizes a diode pair coupled in "anti-parallel", i.e. in parallel but with the directions of the two diodes opposing each other.

The surface mounted power detector 95 is thus an antiparallel diode pair, as shown in FIG. 10. It can suitably be applied in cases where the LO frequency is half of the RF frequency, and the nonlinear relationship between the voltage and the current of the APDP are used for power detection.

The current of an APDP is given by the expression below, which will also be used to explain how the signals at the output ports of the five/six circuit are made to have different phases:

$$i(t) = \sum_{k=0}^{\infty} a_{2k+1} v(t)^{2k+1} \quad (1)$$

where v(t) is the voltage across the APDP. In a five or six-port circuit, the voltage v(t), is the difference between the LO and the RF signal, which can be expressed as:

$$v(t) = V_R \cos(\omega_R t + \phi_{RF}) - V_L \cos\left(\frac{\omega_L}{2} t + \phi_{LO}\right) \quad (2)$$

In (2) above, $V_R$ and $V_L$ are the amplitudes of RF and LO signals, respectively; $\phi_{RF}$ and $\phi_{LO}$ are the phases of the RF and the LO signal, respectively. Inserting (2) into (1), it can be found that, the baseband signal obtained after the low-pass filters is contributed to mainly by the term, $a_3 v(t)^3$, and is given by the expression:

$$i_b(t) = \frac{3a_3}{2} V_R V_L^2 \cos[\phi_{RF} - 2\phi_{LO}] \quad (3)$$

At ports 171, 172 and 173, the phases of the RF signal are $\phi_R$, $\phi_R+\theta$, and $\phi_R+2\theta$, where $\phi_R$ is the phase of the baseband signal. The phases of the LO signal are $\theta$, $\theta/2$ and $0$, where $\theta$ is the same $\theta$ as used in the expression which defines the distance L between the probes, i.e. $\theta=2\pi L/\lambda$.

It should be pointed out that for the same physical lengths of transmission line or waveguide, the electrical length for the LO signal is a half that for RF frequency if an LO frequency is used which is half of the RF frequency. Inserting the RF and LO phases at ports 171, 172, and 173 into expression (3) above yields following equations, in which $i_{bn}(t)$ represents the output of a power detector after the low pass filter at the three ports, i.e. n=1-3 $i_{bn}(t)$:

$$i_{b1}(t) = \frac{3a_3}{2} V_L^2 V_R \cos[\phi_R - 2\theta] \quad (4a)$$

$$i_{b2}(t) = \frac{3a_3}{2} V_L^2 V_R \cos(\phi_R) \quad (4b)$$

$$i_{b3}(t) = \frac{3a_3}{2} V_L^2 V_R \cos[\phi_R + 2\theta] \quad (4c)$$

The in-phase and quadrature components of the baseband signal, i.e. $I=V_R \cos(\phi_R)$ and $Q=V_R \sin(\phi_R)$ are obtained from $i_{b2}(t)$ and $i_{b1}(t)-i_{b3}(t)$, respectively, which are given by:

$$I = \frac{2}{3a_3 V_L^2} [i_{b2}(t)] \quad (5a)$$

-continued $$Q = \frac{1}{3a_3 V_L^2 \sin(2\theta)} [i_{b1}(t) - i_{b3}(t)] \quad (5b)$$

Figure 11:
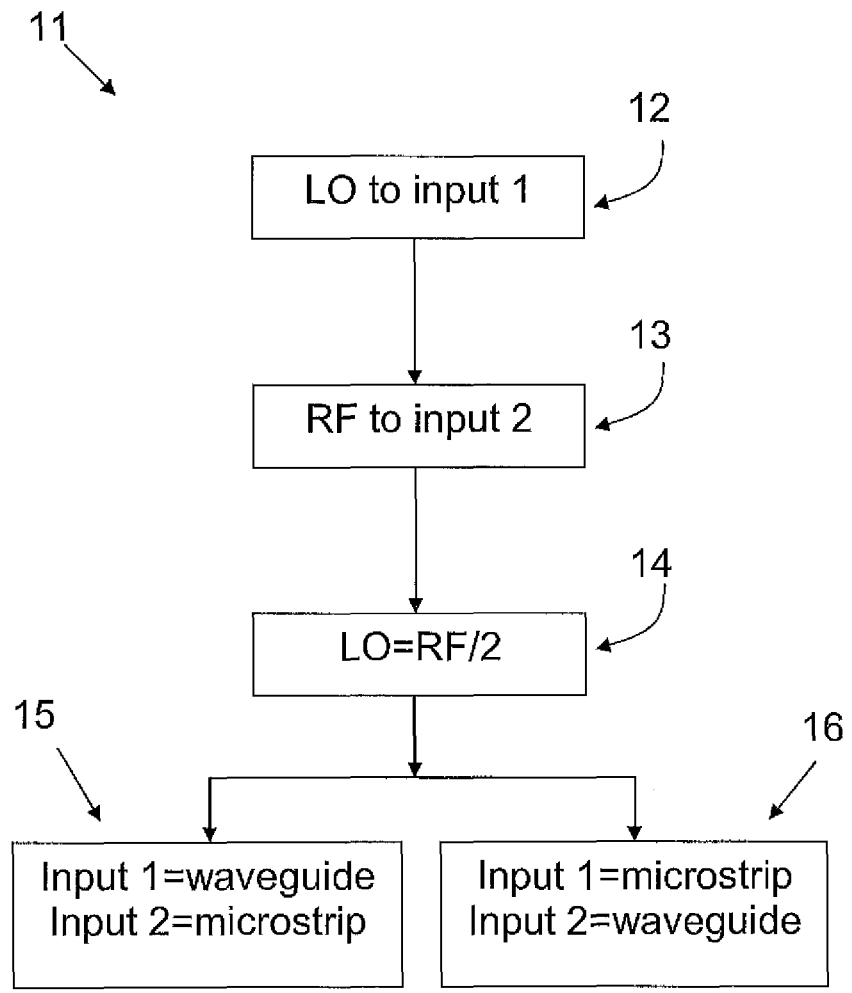
FIG. 11 shows a schematic flow chart of a method of the invention.

FIG. 11 shows a schematic flow chart of a method 11 for use of a five- or six-port circuit as described above. As shown in step 12, the method comprises inputting an LO signal to one of the input ports, "Input 1", of the five- or six-port circuit, and inputting, step 13, an RF signal to the other input port. As shown in step 14, the LO frequency is chosen to be half of RF frequency.

In some embodiments, as shown step 15, the RF signal is used as input signal to the hollow waveguide 105, and the LO signal is used as input signal to the open waveguide 135.

In other embodiments, as shown in step 16, the LO signal is used as input signal to the hollow waveguide 105, and the RF signal is used as input signal to the open waveguide 135.

In conclusion, some unique features of the proposed five- and six-port port circuit are as follows:

A hollow waveguide based five-port circuit for a receiver is obtained, where the hollow waveguide is a part of the circuit.

The RF signal is coupled out by probes, instead of by means of a waveguide-to-microstrip transition.

The hollow waveguide can be mounted on top of a substrate such as a microwave motherboard, while the open waveguide which transmits an input signal, as well as the low-pass filters which can be designed in microstrip technology are arranged either on the other side or on the same side of the substrate as the hollow waveguide.

The power detectors are arranged on the same side of the substrate as the open waveguide The low pass filters are arranged on the same side of the substrate as the open waveguide.

Embodiments of the invention are described with reference to the drawings, such as block diagrams.

In the drawings and specification, there have been disclosed exemplary embodiments of the invention. However, many variations and modifications can be made to these embodiments without substantially departing from the principles of the present invention. Accordingly, although specific terms are employed, they are used in a generic and descriptive sense only and not for purposes of limitation.

The invention is not limited to the examples of embodiments described above and shown in the drawings, but may be freely varied within the scope of the appended claims.

The invention claimed is:

1. A five-port circuit comprising a hollow waveguide mounted with a contacting surface on a first main surface of a non-conducting substrate, the hollow waveguide comprising an input port at its one end and a matched load at its other end, the five-port circuit further comprising three probes arranged along a longitudinal extension of the hollow waveguide and three power detectors, with each of said probes being arranged to contact the input port of one of said power detectors, with the output ports of said power detectors being arranged to contact the conductor of an open waveguide which is also comprised in the five-port circuit and which extends in parallel to the hollow waveguide with an input port at its one end and a matched load at its other end, in which five-port circuit the probes are equidistantly spaced with a distance L between neighbouring probes which corresponds to an electrical length of $\theta$, defined as $\theta=2\pi L/\lambda$, where $\lambda$, is the wavelength which corresponds to the operational frequency of the five-port circuit, said five-port circuit also comprising three low pass filters, each of which is connected with its input port to the conductor of the open waveguide at a position which corresponds to the position of one of the power detectors, so that each probe is arranged in a straight line with one of the power detectors and one of the low pass filters, with the output ports of the low pass filters being arranged to be used as the output ports of the five-port circuit and with the input ports of the hollow waveguide and the open waveguide being arranged at distal ends from each other.

2. A six-port circuit, comprising the five-port circuit of claim 1, equipped with a fourth probe, power detector and low pass filter, the fourth probe being arranged to contact the input port of the fourth power detector, and the output port of the fourth power detector being arranged to contact the conductor of the open waveguide, in which all probes are equidistantly arranged at said distance L, and the fourth probe is arranged in a straight line with the fourth power detector and the fourth low pass filter, with the output port of the fourth low pass filter being used as a fourth output port of the six port circuit.

3. The five-port circuit of claim 1, in which the probes are through-going from the contacting surface of the hollow waveguide to a second main surface of the substrate.

4. The five-port circuit of claim 1, in which the probes are arranged to contact the power detectors inside or on the non-conducting substrate.

5. The five-port circuit of claim 1, in which the input ports of the hollow waveguide and a microstrip line are arranged so that input signals to the hollow waveguide and to the open waveguide will propagate in opposing directions.

6. The five-port circuit of claim 1, in which the hollow waveguide and the open waveguide are straight.

7. The five-port circuit of claim 1, in which the hollow waveguide is a surface mounted waveguide, wherein the contacting surface comprises a separate part of the hollow waveguide which has been fixed to the rest of the hollow waveguide.

8. The five-port circuit of claim 1, in which the power detectors, the open waveguide and the low pass filters are arranged on the second main surface of the substrate.

9. The five-port circuit of claim 1, in which the power detectors, the open waveguide and the low pass filters are arranged on the first main surface of the substrate, and the probes are connected to the power detectors via a connecting conducting line on the second main surface of the substrate which connects to the power detectors by via holes in the substrate.

10. The five-port circuit claim 1, in which the open waveguide is a microstrip line.

11. The five-port circuit claim 1, in which the open waveguide is a coplanar waveguide line.

12. A method of using the five-port circuit of claim 1, comprising inputting an LO signal to one of the input ports and inputting an RF signal to the other input port, wherein the LO frequency is chosen to be half of RF frequency.

13. The method of claim 12, wherein the RF signal is used as an input signal to the hollow waveguide and the LO signal is used as an input signal to the open waveguide.

14. The method of claim 12, wherein the LO signal is used as an input signal to the hollow waveguide and the RF signal is used as an input signal to the open waveguide.

15. The six-port circuit of claim 2, in which the probes are through-going from the contacting surface of the hollow waveguide to a second main surface of the substrate.

16. The six-port circuit of claim 2, in which the probes are arranged to contact the power detectors inside or on the non-conducting substrate.

17. The six-port circuit of claim 2, in which the input ports of the hollow waveguide and a microstrip line are arranged so that input signals to the hollow waveguide and to the open waveguide will propagate in opposing directions.

18. The six-port circuit of claim 2, in which the hollow waveguide and the open waveguide are straight.

19. The six-port circuit of claim 2, in which the hollow waveguide is a surface mounted waveguide, wherein the contacting surface comprises a separate part of the hollow waveguide which has been fixed to the rest of the hollow waveguide.

20. The six-port circuit of claim 2, in which the power detectors, the open waveguide and the low pass filters are arranged on the second main surface of the substrate.

21. The six-port circuit of claim 2, in which the power detectors, the open waveguide and the low pass filters are arranged on the first main surface of the substrate, and the probes are connected to the power detectors via a connecting conducting line on the second main surface of the substrate which connects to the power detectors via holes in the substrate.

22. The six-port circuit of claim 2, in which the open waveguide is a microstrip line.

23. The six port circuit of claim 2, in which the open waveguide is a coplanar waveguide line.

24. A method of using the six port circuit of claim 2, comprising inputting an LO signal to one of the input ports and inputting an RF signal to the other input port, wherein the LO frequency is chosen to be half of RF frequency.

25. The method of claim 24, wherein the RF signal is used as an input signal to the hollow waveguide and the LO signal is used as an input signal to the open waveguide.

26. The method of claim 24, wherein the LO signal is used as an input signal to the hollow waveguide and the RF signal is used as an input signal to the open waveguide.

* * * * *

UNITED STATES PATENT AND TRADEMARK OFFICE
CERTIFICATE OF CORRECTION

Page 1 of 2

PATENT NO. : 8,970,322 B2
APPLICATION NO. : 13/977607
DATED : March 3, 2015
INVENTOR(S) : Bao et al.

It is certified that error appears in the above-identified patent and that said Letters Patent is hereby corrected as shown below:

In the specification

In Column 3, Line 28, delete "invention, and" and insert -- invention, --, therefor.

In Column 3, Line 30, delete "invention, and" and insert -- invention, --, therefor.

In Column 3, Line 31, delete "FIG. 1, and" and insert -- FIG. 1, --, therefor.

In Column 3, Line 33, delete "FIG. 3, and" and insert -- FIG. 3, --, therefor.

In Column 3, Lines 34-35, delete "FIG. 1, and" and insert -- FIG. 1, --, therefor.

In Column 3, Line 36-37, delete "invention, and" and insert -- invention, --, therefor.

In Column 3, Line 39, delete "invention, and" and insert -- invention, --, therefor.

In Column 3, Line 41, delete "FIG. 6, and" and insert -- FIG. 6, --, therefor.

In Column 3, Line 43, delete "FIG. 7, and" and insert -- FIG. 7, --, therefor.

In Column 5, Line 37, delete "140." and insert -- 135. --, therefor.

In Column 6, Line 47, delete "140" and insert -- 135 --, therefor.

In Column 8, Line 20, delete

" $v(t) = V_R \cos(\omega_R t + \phi_{RF}) - V_L \cos\left(\dfrac{\omega_L}{2} t + \phi_{LO}\right)$ " and insert -- $v(t) = V_R \cos(\omega_R t + \phi_{RF}) - V_L \cos\left(\dfrac{\omega_L}{2} t + \phi_{LO}\right)$ --, therefor.

Signed and Sealed this
Twenty-third Day of February, 2016

Michelle K. Lee
*Director of the United States Patent and Trademark Office*

CERTIFICATE OF CORRECTION (continued)
U.S. Pat. No. 8,970,322 B2

In the claims

In Column 9, Line 64, in Claim 1, delete "λ," and insert -- λ --, therefor.

In Column 12, Line 8, in Claim 24, delete "six port" and insert -- six-port --, therefor.